(12) United States Patent
Fukuda et al.

(10) Patent No.: US 6,262,516 B1
(45) Date of Patent: Jul. 17, 2001

(54) PARALLEL PLATE STRUCTURE PROVIDED WITH PZT THIN-FILM BIMORPH AND METHOD OF FABRICATION THEREOF

(75) Inventors: Toshio Fukuda; Fumihito Arai, both of Nagoya; Koichi Itoigawa; Hitoshi Iwata, both of Aichi, all of (JP)

(73) Assignee: Kabushiki Kaisha Tokai Rika Denki Seisakusho, Niwa-gun (JP)

( * ) Notice: Subject to any disclaimer, the term of this patent is extended or adjusted under 35 U.S.C. 154(b) by 0 days.

(21) Appl. No.: 09/380,014

(22) PCT Filed: Jul. 1, 1998

(86) PCT No.: PCT/JP98/02991
§ 371 Date: Aug. 23, 1999
§ 102(e) Date: Aug. 23, 1999

(87) PCT Pub. No.: WO99/01901
PCT Pub. Date: Jan. 14, 1999

(30) Foreign Application Priority Data

Jul. 4, 1997 (JP) ................................. 9-179599

(51) Int. Cl.$^7$ ................................. H01L 41/04
(52) U.S. Cl. ................. 310/328; 310/330; 310/331; 310/321
(58) Field of Search .................. 310/328, 330, 310/331, 321

(56) References Cited

U.S. PATENT DOCUMENTS 5,166,571 * 11/1992 Konno ................................. 310/321
5,912,524 * 6/1999 Ohmishi ................................. 310/321

FOREIGN PATENT DOCUMENTS

| | | | |
|---|---|---|---|
| 59-111060 A1 | * 1/1983 | (JP) | ................ H01L/41/08 |
| 59-111060 | 7/1984 | (JP) . | |
| 59-229733 | 12/1984 | (JP) . | |
| 4-65470 | 6/1992 | (JP) . | |
| 65470 A1 | * 6/1992 | (JP) | ................ H01L/41/08 |
| 05259525 | 10/1993 | (JP) . | |
| 08293631 | 11/1996 | (JP) . | |
| 62-146426 | 6/1997 | (JP) . | |
| 99/01901 | 1/1999 | (WO) . | |

* cited by examiner

Primary Examiner—Nestor Ramirez
Assistant Examiner—Karen Addison
(74) Attorney, Agent, or Firm—Robert D. Buyan; Stout, Uxa, Buyan & Mullins, LLP (57) ABSTRACT

A parallel plate structure (1) is provided with a pair of bimorph piezoelectric elements (2) and prismatic insulation spacers (3) inserted between the piezoelectric elements (2) at the upper and lower ends thereof for cementing the piezoelectric elements (2) together via the spacers (3). Each piezoelectric element (2) comprises a planar base material (4) of titanium, PZT thin films (5) formed on both sides of the base material (4) by the hydrothermal method, and electrode films (6) formed on the PZT thin films (5). The base material (4) is 20 $\mu$m thick and the PZT thin films (5) are several pm thick, while the aluminum electrode films (6) are several um thick.

12 Claims, 6 Drawing Sheets

PARALLEL PLATE STRUCTURE PROVIDED WITH PZT THIN-FILM BIMORPH AND METHOD OF FABRICATION THEREOF

BACKGROUND OF THE INVENTION

The present invention relates to a parallel plate structure provided with a PZT lead (Pb) Zirconate Titanate) thin-film bimorph and method of fabrication thereof, and more particularly, to structures used as piezoelectric actuators.

A bimorph, which is known in the prior art, includes a plate-like substrate, two PZT devices (lead zirconate titanate: ceramics containing a solid solution of lead titanate and lead zirconate), which are formed on the front and rear surfaces of the substrate and which function as piezoelectric devices, and electrodes formed on each PZT device. Voltage is applied to both of the PZT devices so that one of the PZT devices expands while the other contracts. Since this deforms the bimorph entirely in a certain direction, the bimorph is used as an actuator.

However, when employing preformed PZT devices, it is difficult to make the devices thinner in subsequent processes. Accordingly, the production of a more compact bimorph is difficult. Furthermore, alot of time is requiring to adhere the PZT devices to the front and rear surfaces the substrate. This lengthens the fabrication time of the bimorph.

Additionally, since the bimorph is formed as a monolithic single plate, the bimorph is apt to deform in an undesirable direction. This results in a shortcoming in which the bimorph twists and does not deform accurately.

SUMMARY OF THE INVENTION

Accordingly, it is an objective of the present invention to provide a parallel plate structure having a PZT thin-film bimorph that deforms by a large degree.

Another objective of the present invention is to provide a parallel plate structure having a PZT thin-film bimorph that is optimal for mass-production, can be made more compact, and resists twisting.

A further objective of the present invention is to provide a parallel plate structure having a PZT thin-film bimorph that has superior productivity.

A parallel plate structure, which is provided with a bimorph, according to the present invention, has a thin PZT thin-film formed on a first and second surface of a titanium substrate. Thus, the bimorph is more compact. This, in turn, makes the entire structure more compact. Furthermore, the parallel plate structure is a duplex structure in which a pair of bimorphs are superimposed by way of a spacer. Hence, the structure has improved rigidity and resists twisting.

When deforming the structure, voltage having opposite polarities is applied to adjacent electrodes on a first surface of each bimorph. As a result, the portion of the PZT thin-film to which an electric field in the polarity direction is applied contracts, while the portion of the PZT thin-film to which an electric field in the direction opposite the polarity direction is applied expands.

Due to the application of the same voltage, each bimorph deforms in the same direction. Due to the application of voltage having different polarities to the adjacent electrodes on each surface of each bimorph, the portions of the PZT thin-film to which the voltage of different polarities are applied deform in opposite directions. As a result, since the portions of the PZT thin-film corresponding to the adjacent electrodes deform in opposite directions, the structure is bent in an S-shaped or reversed S-shaped manner and deformed.

DETAILED DESCRIPTION

A parallel plate structure provided with a PZT thin-film bimorph according to an embodiment of the present invention will now be described with reference to FIGS. 1 to 10. The thicknesses of each member shown in the drawings are exaggerated for illustrative purposes.

Figures 1A, 1B:
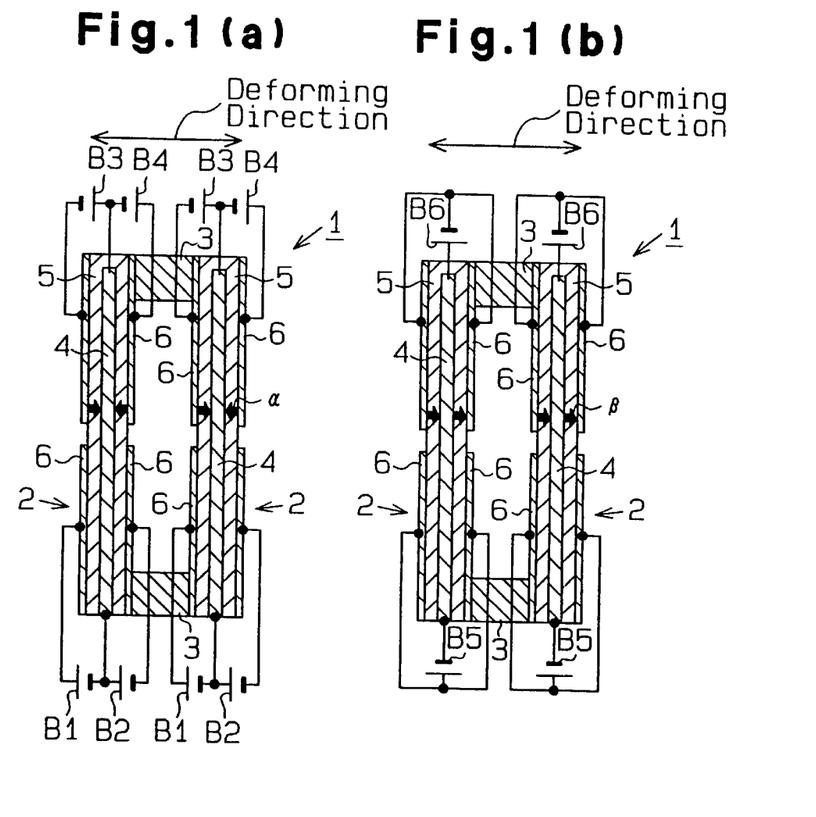
FIG. 1(a) is a cross-sectional view showing the application of voltage to a parallel plate structure, which is provided with a PZT thin-film bimorph, according to an embodiment of the present invention.
FIG. 1(b) is a cross-sectional view showing further application of voltage to the structure of FIG. 1(a)

As shown in FIGS. 1(a) and (b), a parallel plate structure 1 includes a pair of plate-like piezoelectric devices 2, or bimorphs, and rectangular column-like insulating spacers 3, which are arranged between the piezoelectric devices 2. The spacers 3 connect the piezoelectric devices 2 at the upper and lower ends of the structure 1 and are made of an insulating material to prevent short-circuiting between the piezoelectric devices 2.

Each piezoelectric device 2 includes a plate-like titanium substrate 4 having uniform thickness, a PZT thin-film 5 formed on the two sides of the titanium substrate 4, and pairs of upper and lower electrodes or electrode films 6 formed on each PZT thin-film 5. The electrode films 6 are insulated from each other. One electrode 6 film extends from one end of the associated PZT thin-film 5 substantially to the middle portion of the PZT thin-film 5, while the other electrode film 6 extends from the other end of the PZT thin-film 5 substantially to the middle portion. Each electrode film 6 occupies nearly half the area of the associated PZT thin-film 5. The substrate 4 has a thickness of 20 μm, while the PZT thin-film 5 has a thickness of several tens of micrometers. The electrode films 6 are made of aluminum and have a thickness of several micrometers.

When using the structure 1 as an actuator, dc power sources B1–B4 are connected to the structure 1 as shown in FIGS. 1(a) and (b). In FIG. 1(a), the polarity direction of the PZT thin-film 5 is indicated by arrows α. The power sources B1, B2 are connected in series. The positive terminal of each power source B1 is connected to the lower left electrode film 6 of the associated piezoelectric device 2. The negative terminal of each power source B2 is connected to the lower right electrode film 6 of the associated piezoelectric device 2. The contact between the power sources B1, B2 is connected to the associated titanium substrate 4.

Like the power sources B1, B2, the power sources B3, B4 are connected in series. The positive terminal of the power source B4 is connected to the upper right electrode film 6 of the associated piezoelectric device 2, as viewed in FIG. 1(a). The negative terminal of the power source B3 is connected to the upper left electrode film 6 of the associated piezoelectric device 2. The contact between the power sources B3, B4 is connected to the associated titanium substrate 4.

The connection between the contact of the power sources B1, B2 and the titanium substrates 4 and the connection between the contact of the power sources B3, B4 and the titanium substrates 4 apply a uniform electric field to the PZT thin-film 5 on each side of the titanium substrates 4. However, the contacts are not required to be connected to the substrate 4 as long as each PZT thin-film 5 has the same thickness. The power sources B1–B4 have the same voltage, which is applied to the PZT thin films 5 by the electrode films 6. Voltage having opposite polarities is applied to the upper and lower portions of each piezoelectric device 2.

Figures 2A, 2B:
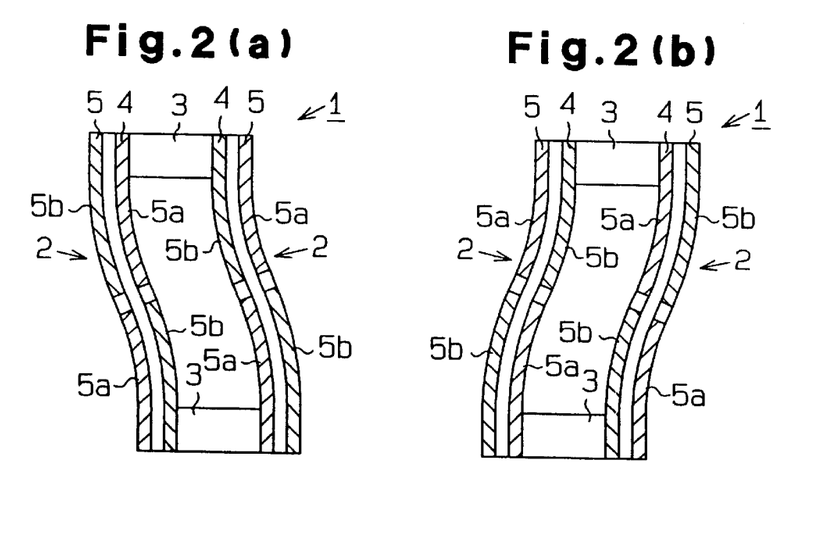
FIG. 2(a) is a cross-sectional view showing a deformed state of the structure of FIG. 1(a)
FIG. 2(b) is a cross-sectional view showing a further deformed state of the structure of FIG. 1(a)

When the lower end (basal end) of the structure 1 is fixed to a base (not shown) and voltage is applied to the structure 1 as shown in FIG. 1(a), the portion of the PZT thin-film 5 to which an electric field is applied in the polarity direction expands in the polarity direction and contracts in the direction perpendicular to the polarity direction. On the other hand, the portion of the PZT thin-film 5 to which an electric field is applied in the direction opposite the polarity direction contracts in the polarity direction and expands in the direction perpendicular to the polarity direction. As a result bearing in mind that the bottom of the structure 1 is fixed, the structure 1 bends to the left at its lower portion and bends to the right at its upper portion as shown in FIG. 2(a). Hereafter, the expansion and contraction of the PZT thin-film 5 in the direction perpendicular to the polarity direction will be described.

When voltage having a polarity opposite that of FIG. 1(a) is applied to the PZT thin films 5, the upper right portion and lower left portion of each piezoelectric device 2 expands, while the upper left portion and lower right portion of each piezoelectric device 2 contracts. As a result, the structure 1 bends to the right at its lower portion and bends to the left at its upper portion as shown in FIG. 2(b).

In FIGS. 2(a) and (b), the electrode films 6 are not shown. The compressed portions 5a of the PZT thin-films 5 are shown by the hatch lines extending downward from right to left, and the expanded portions 5b are shown by the hatch lines extending downward from left to right.

In FIG. 1(b), the polarity direction of the PZT thin-film 5 is indicated by arrows β. As shown in the same drawing, the positive terminal of each power source B5 is connected to the associated substrate 4. The negative terminal of each power source B5 is connected to the electrode films 6 on each side of the lower portion of the associated piezoelectric device 2. The negative terminal of each power source B6 is connected to the associated substrate 4. The positive terminal of each power source B6 is connected to the electrode films 6 on each side of the upper portion of the associated piezoelectric device 2. When each electric source B5 applies a positive potential to the associated PZT thin-film 5, the lower right portion of the PZT thin-film 5 expands, while the lower left portion of the PZT thin-film 5 contracts (deforming to the left as viewed in FIG. 1(b)). When each electric source B6 applies a negative potential to the associated PZT thin-film 5, the upper right portion of the PZT thin-film contracts, while the upper left portion of the PZT thin-film 5 expands. Accordingly, the structure 1 bends to the left at its lower portion and bends to the right at its upper portion as shown in FIG. 2(a). If the polarity direction of the PZT thin-films 5 is β, the same deformation amount as that of FIG. 1(a) is obtained with half the voltage of the power sources B1–B4 of FIG. 1(a).

Furthermore, when a voltage having a polarity opposite to that of FIG. 1(b) is applied to the PZT thin-films 5, the structure 1 bends to the right at its lower portion and bends to the left at its upper portion as shown in FIG. 2(b).

The manufacturing process of the structure will now be described with reference to FIGS. 3 to 10.

Figure 3:
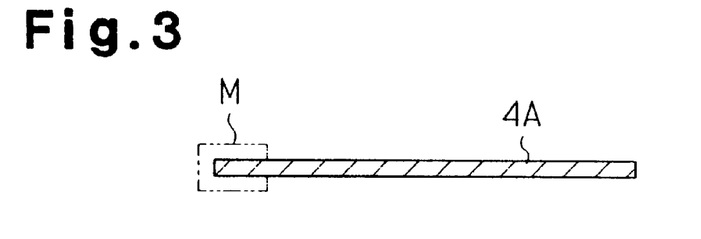
FIG. 3 is a cross-sectional view showing a substrate insert of a PCT biomorph in accordance with the present invention.

As shown in FIG. 3, a titanium base material 4A is prepared. The base material 4A is plate-like and has a uniform thickness. The base material 4A has an area equal to that of a plurality of the substrates 4 of the structure 1. The base material 4A is first cleaned with acid or the like. A mask M is then applied to one end (corresponding to the basal side in FIG. 1) of the base material 4A. The mask M is formed from a synthetic resin or from a metal other than titanium by employing a physical film formation process, such as sputtering or vacuum deposition.

Figure 4:
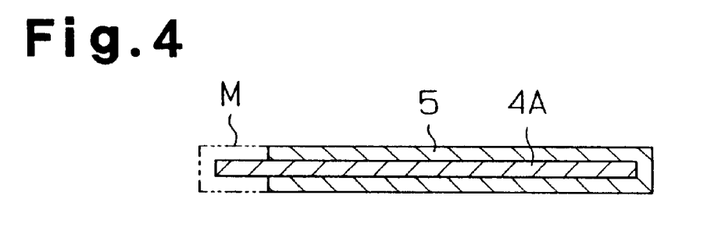
FIG. 4 is a cross-sectional view showing the substrate of FIG. 3 of a PZT biomorph in accordance with the present invention covered by a PZT thin-film.

Afterward, as shown in FIG. 4, a PZT thin-film 5 is formed on both sides of the base material 4A using a hydrothermal process. The hydrothermal process includes two stages as described below.

First Stage

The base material 4A, raw material, which is an aqueous is solution containing zirconium oxychloride ($ZrOCl_2.8H_2O$) and lead nitrate ($Pb(NO_3)_2$), and a KOH (8N) solution, which is a mineralizer, are placed in a Teflon container (not shown) and agitated. The piezoelectric characteristic of the PZT thin films 5 is determined by the composition ratio of lead titanate and lead zirconate. Thus, the mol ratio between the zirconium oxychloride and the lead nitrate is determined in accordance with the piezoelectric characteristic of the PZT thin films 5, which are formed later.

Afterward, with the base material 4A arranged at the upper portion of a pressure vessel (not shown), an aqueous solution containing zirconium oxychloride ($ZrOCl_2.8H_2O$) and lead nitrate ($Pb(NO_3)_2$), and a KOH(8N) solution are mixed in the pressure vessel. The mixture is heated and pressurized while being agitated at a speed of 300 rpm. Pressurizing refers to pressurizing using the vapor pressure of the heated solution. The heated and pressurized state lasts for 48 hours under a temperature of 150° C. Consequently, PZT seed crystals (crystal nucleus) are formed on both sides of the base material 4A in a supersaturated state. After the formation of the seed crystals, the base material 4A is removed from the pressure vessel, washed with water, and dried.

Second Stage

Subsequently, the base material 4A, on which the seed crystals are formed, raw material, which is an aqueous solution containing zirconium oxychloride ($ZrOCl_2 \cdot 8H_2O$) and lead nitrate ($Pb(NO_3)_2$), a solution containing titanium tetrachloride ($TiCl_4$) and potassium hydroxide (KOH(4N)), which serves as a mineralizer, are placed in a Teflon container (not shown) and agitated. The mol ratio between zirconium oxychloride and lead nitrate is determined in accordance with the PZT piezoelectric characteristic.

Then, with the base material 4A arranged at the upper portion of a pressure vessel (not shown), an aqueous solution containing zirconium oxychloride ($ZrOCl_2 \cdot 8H_2O$) and lead nitrate ($Pb(NO_3)_2$), and a solution containing titanium tetrachloride (TiCl4) and KOH(4N) are mixed in the pressure vessel, and heated and pressurized while being agitated at a speed of 300 rpm. Pressurizing refers to pressurizing using the vapor pressure of the heated solution. This treatment lasts for 48 hours under a temperature of 120° C. Consequently, a PZT thin film 5 having the predetermined thickness (in the present embodiment, several tens of micrometers) is formed on both sides of the base material 4A in a supersaturated state (refer to FIG. 4). After the formation of the PZT thin film 5, the base material 4A is removed from the pressure vessel, washed with water, and dried. Afterward, the mask M is removed.

Figure 5:
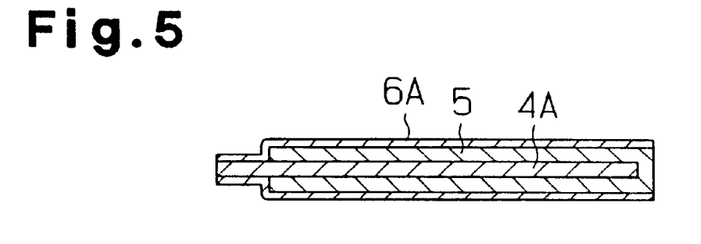
FIG. 5 is a cross-sectional view showing the substrate of FIG. 3 on which electrode films are formed.
Figure 6:
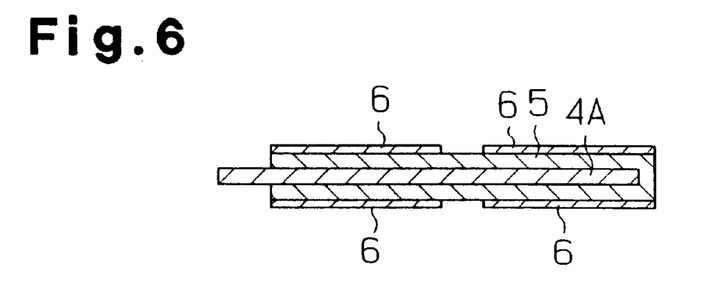
FIG. 6 is a cross-sectional view showing a piezoelectric device formed on the substrate of FIG. 4.
Figure 7:
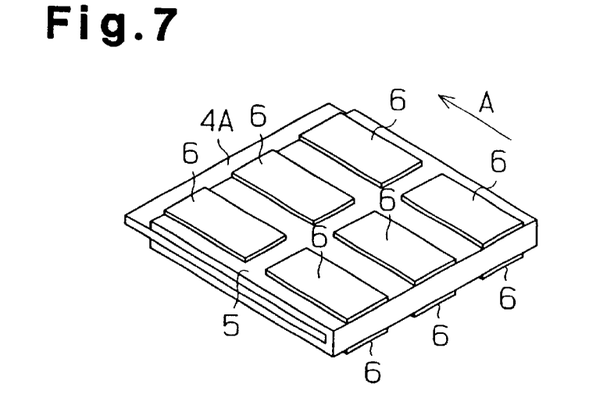
FIG. 7 is a perspective view showing the piezoelectric device of FIG. 6.

As shown in FIG. 5, an electrode film 6A is then formed on each side of the base material 4A, which includes the PZT thin film 5, by carrying out a physical film formation process, such as sputtering or vacuum deposition. As shown in FIGS. 6 and 7, patterning is then performed to remove unnecessary sections of the electrode films 6A in order to obtain a plurality of piezoelectric devices 2 (three in the present embodiment) from the base material 4A. As a result, in the present invention, three rows of electrode films 6, each extending in a direction indicated by arrow "A", are formed on the PZT thin film 5 on each side of the base material as shown in FIG. 7. Each row includes two electrode films 6, which have the same area and the same shape. As shown in FIG. 7, the electrode films 6 are arranged on both sides of the titanium substrate 4 such that they are opposed to each other with the base material 4A arranged in between.

Figure 8:
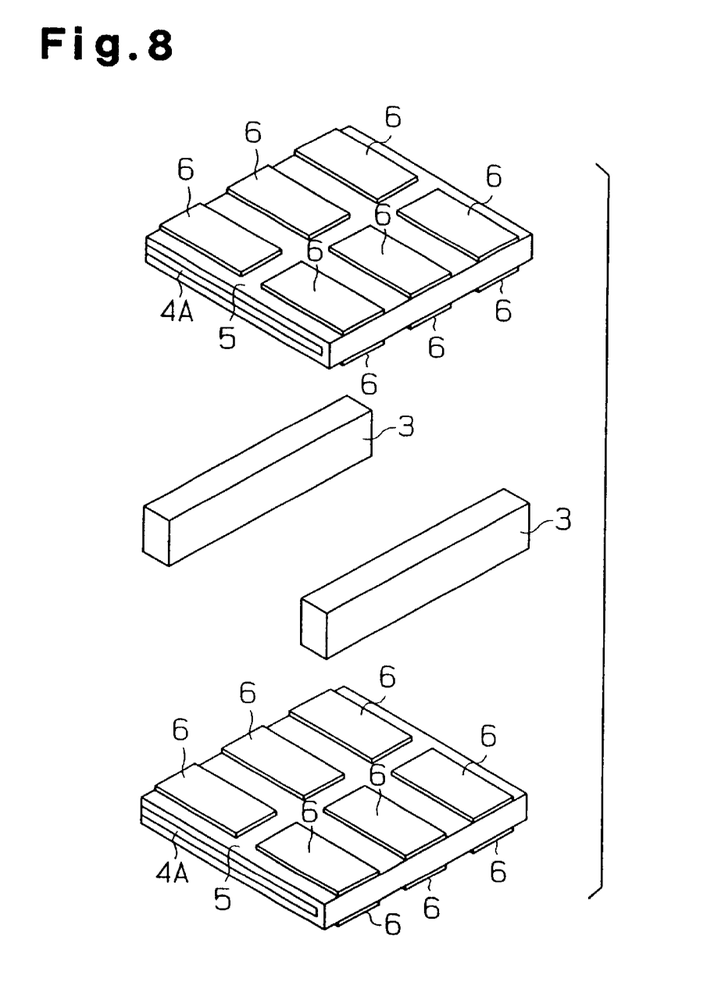
FIG. 8 is an exploded perspective view showing the assembly of a parallel plate structure in accordance with the present invention.

As shown in FIG. 8, the unnecessary sections of the base material 4A are removed. Subsequently, two base materials 4A, which include the PZT thin film 5 and the electrode films 6 are faced toward each other. Rectangular column-like insulating spacers 3, which are made from synthetic resin, are then arranged between the two base materials 4A.

Figure 9:
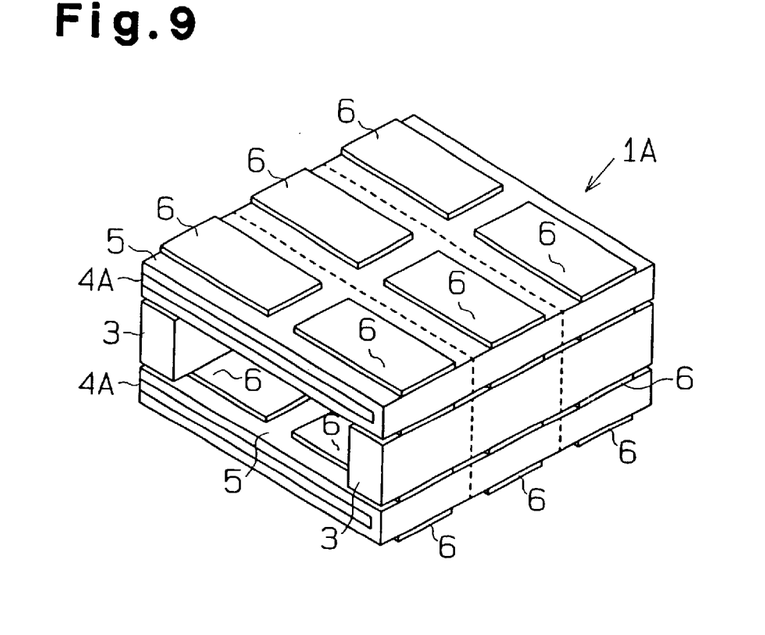
FIG. 9 is a perspective view showing the assembled parallel plate structure of FIG. 8 in accordance with the present invention.

As shown in FIG. 9, the base materials 4A and the spacers 3 are fixed to one another with an adhesive agent, which increases rigidity after hardening, to form a parallel plate structure 1A. The structure 1A is formed by interconnecting independent structure bodies.

Figure 10:
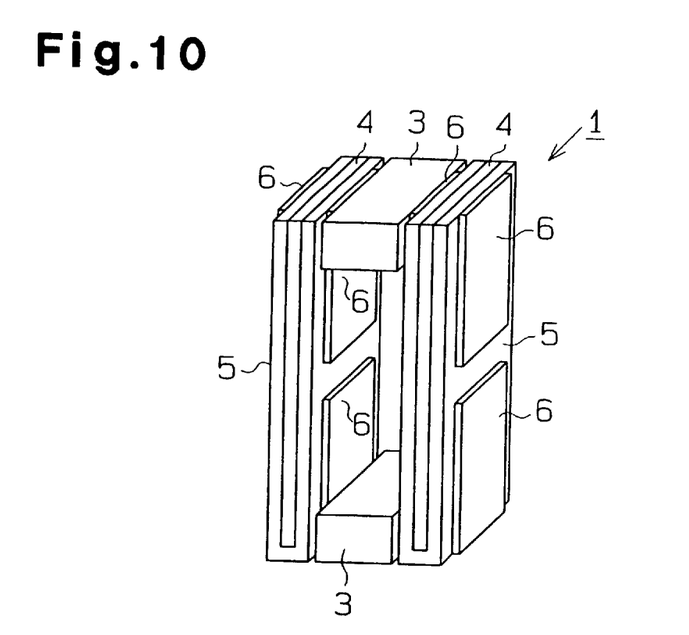
FIG. 10 is another perspective view showing the structure ofFIG. 8 of FIG. 9.

The structure 1A is then cut along the dotted lines between each row of electrode films 6 to separate the structure 1A into independent parallel plate structures 1 as shown in FIG. 10. The cutting is performed by electric discharge machining or laser cutting.

As described above, the application of voltage having opposite polarities to the upper and lower portions of the piezoelectric devices 2 deforms the structure 1 as shown in FIGS. 2(a) or 2(b). This deformation mode will hereafter be referred to as a parallel plate actuation mode.

Figure 11:
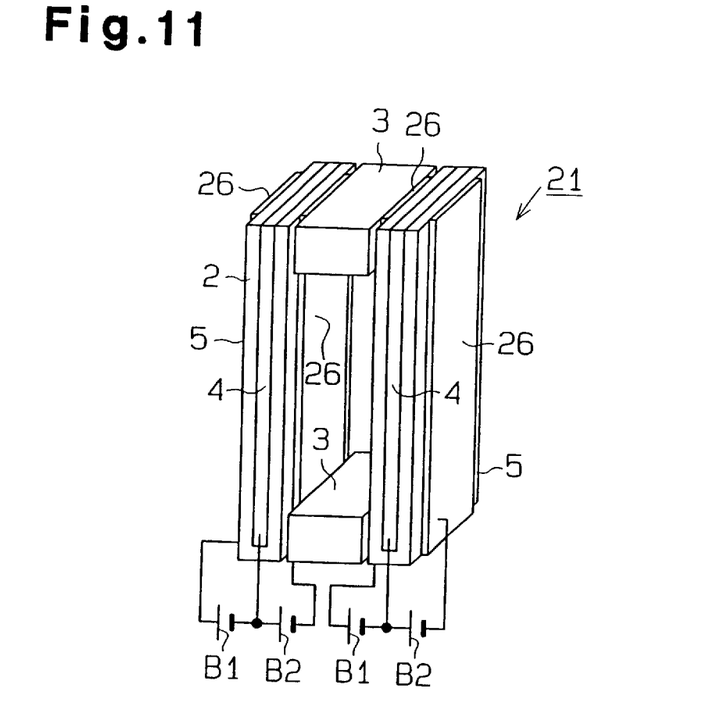
FIG. 11 is another perspective view showing a structure provided with a bimorph of a comparative example.

A parallel plate structure 21, which is provided with bimorphs, is shown in FIG. 11 as a comparative example. In the drawing, like numerals are used for like elements of the structure 1 of the present embodiment.

The structure 21 of the comparative example differs from the structure 1 of the present embodiment in that only one electrode film 26 is formed on each side of a titanium substrate 4. Power sources B1, B2 are connected to the structure 21 in a series. The positive terminal of each power source B1 is connected to the left electrode film 26 of the associated piezoelectric device 2. The negative terminal of each power source B2 is connected to the right electrode film 26 of the associated piezoelectric device 2. The contact between the power sources B1, B2 is connected to the associated titanium substrate 4. In the comparative example, the polarity direction of the PZT thin-films 5 is the same as that shown in FIG. 1(a).

When the lower end of the structure 21 is fixed to a base (not shown) and voltage is applied as shown in FIG. 11, the portion of the PZT thin-film 5 to which an electric field is applied in the polarity direction contracts, while the portion of the PZT thin-film 5 to which an electric field is applied in the direction opposite the polarity direction expands. Accordingly, the structure 21 deforms to the left as viewed in FIG. 11.

Figure 12:
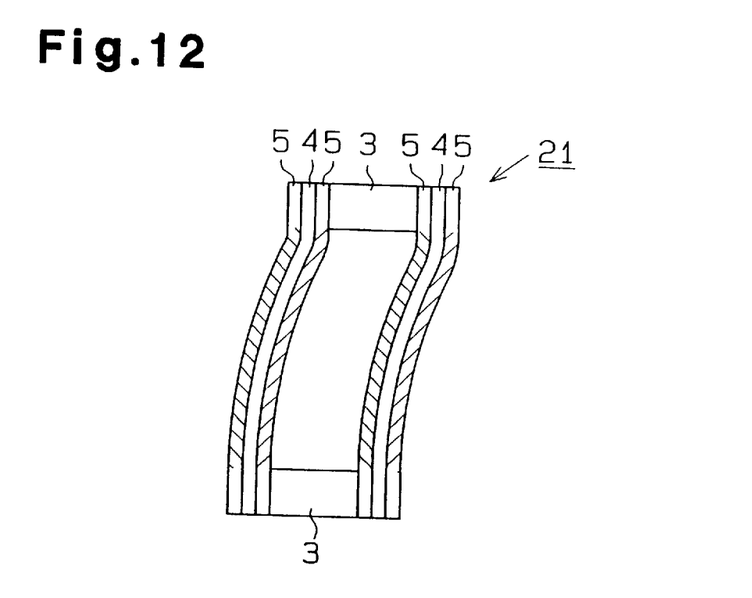
FIG. 12 is a cross-sectional view showing the structure of FIG. 11 in a deformed state.

On the other hand, the application of voltage having the opposite polarity to the piezoelectric devices 2 contracts the right PZT thin-film 5 of each piezoelectric device 2 and expands the left PZT thin-film 5 of each piezoelectric device 2. Accordingly, the structure 21 deforms to the right as shown in FIG. 12. The electrode films 26 of the comparative example are not shown in FIG. 12. The contracted portions of the PZT thin-films 5 are shown by the hatch lines extending downward from right to left, and the expanded portions are shown by the hatch lines extending downward from left to right.

Figure 13:
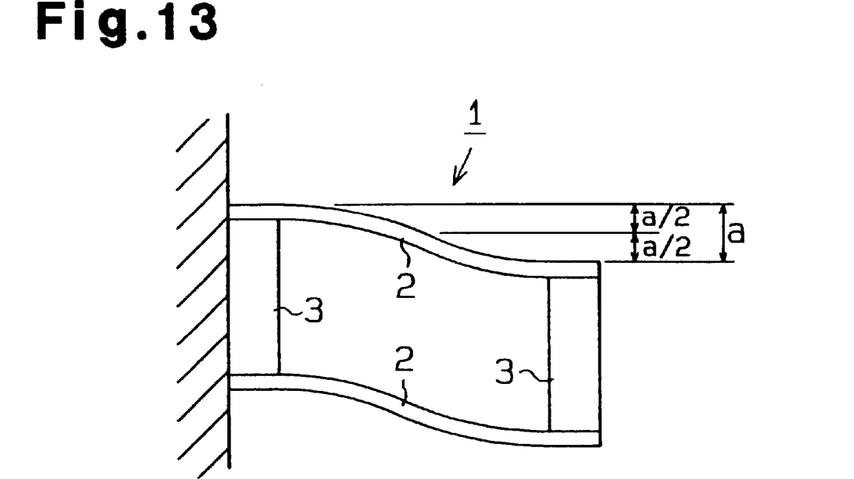
FIG. 13 is a schematic view showing the structure of FIG. 10 in a parallel plate actuation mode.

When the same voltage is applied to the structure 1 and the structure 21, the deformation amount of the structure 1 is greater than that of the structure 21. The reasons for this will be described with reference to FIGS. 13 and 14. FIG. 13 shows the deformation of the structure 1 of the present embodiment, while FIG. 14 shows the deformation of the structure 21 of the comparative example.

Figure 14:
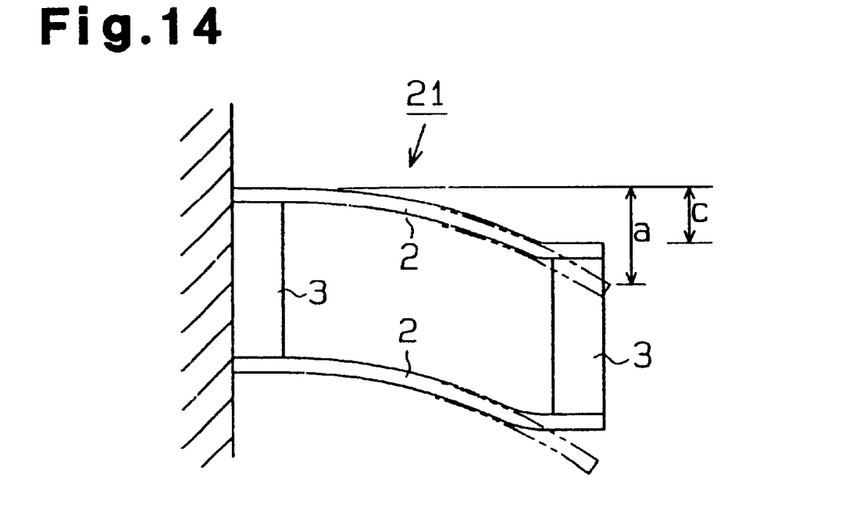
FIG. 14 is a schematic view showing the structure of FIG. 10 of FIG. 11 in a simple bending actuation mode.

In FIG. 14, "a" denotes deformation during application of voltage when the insulating spacer 3 at the free end does not exist. Attachment of the insulating spacer 3 interferes with the deformation of the piezoelectric devices 2 and changes the deformation to "c" (c<a). In FIG. 13 application of voltage to, the two electrodes results in the deformation being a/2 at the fixed end of the piezoelectric device 2. Furthermore, the free end of the piezoelectric device 2 deforms in the same manner as the fixed side. The free end side deformation is thus a/2 and the total deformation of the structure 1 is a. Accordingly, the deformation amount of the structure 1 of the present embodiment is greater than the deformation amount of the structure 21 when the structures have one end fixed to a base.

In the present embodiment, the PZT thin-film 5 is thin with a thickness of several tens of micrometers. This, decreases the size of the piezoelectric devices 2, which in turn, decreases the size of the structure 1.

The structure 1 of the present embodiment is a parallel plate structure, in which a pair of bimorphs, or piezoelectric devices 2, and spacers are superimposed. Thus, twist resistance is improved.

The fabrication method of the structure 1 of the present embodiment efficiently manufactures structures 1 having uniform quality since the hydrothermal process forms the PZT thin-film 5 and the electrode films 6 simultaneously on a plurality of substrates 4. Since spacers are used to fix the bimorphs to each other, the formation of the structure 1 is simplified.

The embodiment according to the present invention may be modified as described below.

The insulating spacers 3 may be replaced by spacers made of a non-insulating material, such as metal, as long as the piezoelectric devices 2 are insulated from each other. In this case, the spacers are fixed to the piezoelectric devices 2 using other means such as welding. Furthermore, the electrode films 6 may be formed from other metals, such as gold (AU), instead of aluminum.

The thickness of the electrode films 6, the PZT thin-films 5, and the substrates 4 is not limited to the above values and may be changed as required.

In the above embodiment, three bimorphs are obtained from the same base material 4A. However, two or less or four or more bimorphs may be obtained from the same material.

What is claimed is:

1. A parallel plate structure including a pair of parallel bimorphs (2), and a spacer (3) for connecting the bimorphs (2), wherein each bimorph (2) has a titanium substrate (4), the titanium substrate (4) having a first surface and a second surface, which is located on the opposite side of the first surface, and a PZT thin-film (5) formed on each of the first and second surfaces, wherein the parallel plate structure is characterized by:

a plurality of spaced electrodes (6) formed on each PZT thin-film (5) and extending in the same direction.

2. The parallel plate structure according to claim 1 characterized in that the number of electrodes (6), which includes first and second electrodes (6), on each of the first and second surfaces is two.

3. The parallel plate structure according to claim 2 characterized in that the first electrode (6) extends from one end to a substantially middle portion of the associated PZT thin-film (5), and the second electrode (6) extends from the other end to the substantially middle portion of the associated PZT thin-film (5).

4. The parallel plate structure according to claim 1, characterized in that the PZT thin-film (5) is formed via a hydrothermal process.

5. The parallel plate structure according to claim 1, characterized in that the spacer (3) is arranged at one end of the bimorphs (2), and a further spacer (3) is arranged at the other end of the bimorphs (2), wherein both spacers (3) are insulating bodies.

6. A piezoelectric device, comprising:

a pair of parallel bimorphs, each bimorph including a substrate having a first surface and a second, opposing surface, and a PZT thin-film formed on each of the first and second surfaces;

a first spacer disposed between and connecting the bimorphs at a first end of the bimorphs; and at least one electrode formed on each PZT thin-film.

7. The piezoelectric device of claim 6, wherein the substrate is made of titanium.

8. The piezoelectric device of claim 6, further comprising a second spacer disposed between and connecting the bimorphs at a second end, opposite the first end, of the bimorphs.

9. The piezoelectric device of claim 6, wherein the spacers are made from an insulating material.

10. The piezoelectric device of claim 6, wherein two electrodes are formed on each of the PZT thin-films.

11. The piezoelectric device of claim 10, wherein the two electrodes extend from opposing ends of the respective surface on which the thin-film is formed toward a center part of the surface.

12. The piezoelectric device of claim 11, wherein the electrodes are made of aluminum.

\* \* \* \* \*